(12) United States Patent
Oliver et al.

(10) Patent No.: US 6,819,725 B1
(45) Date of Patent: Nov. 16, 2004

(54) JITTER FREQUENCY SHIFTING Δ-Σ MODULATED SIGNAL SYNCHRONIZATION MAPPER

(75) Inventors: Gordon Robert Oliver, Port Moody (CA); Larrie Carr, Burnaby (CA)

(73) Assignee: PMC-Sierra, Inc., Burnaby (CA)

( * ) Notice: Subject to any disclaimer, the term of this patent is extended or adjusted under 35 U.S.C. 154(b) by 639 days.

(21) Appl. No.: 09/641,980

(22) Filed: Aug. 21, 2000

(51) Int. Cl.[7] .................................................. H04L 7/00
(52) U.S. Cl. ....................... 375/371; 375/372; 375/377
(58) Field of Search ................................ 375/371, 372, 375/373, 377, 293, 294, 327, 355, 363, 362, 359, 375, 376; 370/505, 516, 503, 504, 506, 518, 509; 341/144, 155, 164, 165, 67, 61; 365/189.01, 189.04, 189.05; 369/47.19

(56) References Cited

U.S. PATENT DOCUMENTS

| | | | | |
|---|---|---|---|---|
| 4,764,941 A | * | 8/1988 | Choi ........................... | 375/112 |
| 4,791,652 A | * | 12/1988 | McEachern et al. ........ | 375/111 |
| 4,811,340 A | * | 3/1989 | McEachern et al. ........ | 370/102 |
| 5,067,126 A | | 11/1991 | Moore | |
| 5,131,013 A | * | 7/1992 | Choi ........................... | 375/118 |
| 5,225,787 A | * | 7/1993 | Therssen .................... | 327/113 |
| 5,268,935 A | * | 12/1993 | Mediavilla et al. ......... | 375/372 |
| 5,268,936 A | * | 12/1993 | Bernardy .................... | 375/372 |
| 5,327,430 A | * | 7/1994 | Urbansky ................... | 370/465 |
| 5,337,315 A | | 8/1994 | Ehrlich | |
| 5,402,452 A | * | 3/1995 | Powell et al. ............... | 375/372 |
| 5,539,785 A | * | 7/1996 | Burch et al. ................ | 375/371 |
| 5,563,891 A | | 10/1996 | Wang | |
| 5,619,506 A | | 4/1997 | Burch et al. | |
| 5,625,358 A | * | 4/1997 | Wilson et al. .............. | 341/143 |
| 5,627,536 A | * | 5/1997 | Ramirez ..................... | 341/141 |
| 5,680,422 A | * | 10/1997 | Burch et al. ................ | 375/371 |
| 5,757,869 A | * | 5/1998 | Sands et al. ................ | 375/366 |
| 5,910,753 A | | 6/1999 | Bogdan | |
| 6,044,124 A | * | 3/2000 | Monahan et al. ........... | 375/376 |
| 6,208,211 B1 | * | 3/2001 | Zipper et al. ................ | 331/17 |
| 6,215,423 B1 | * | 4/2001 | May et al. ................... | 341/61 |
| 6,278,394 B1 | * | 8/2001 | May ........................... | 341/144 |
| 6,535,567 B1 | * | 3/2003 | Girardeau, Jr. ............. | 375/372 |

OTHER PUBLICATIONS

Tom A.D. Riley, Miles A. Copeland and Tad A. Kwasniewski, "Delta–Sigma Modulation in Fractional–N Frequency Synthesis" *IEEE Journal of Solid–State Circuits* vol. 28, No. 5, May 1993, pp553–559.

\* cited by examiner

*Primary Examiner*—Tesfaldet Bocure
*Assistant Examiner*—Khanh Tran
(74) *Attorney, Agent, or Firm*—Oyen Wiggs Green & Mutala

(57) ABSTRACT

A signal synchronization mapper for mapping an input data stream characterized by a first frequency (typically a SONET/SDH stream) into an output data stream characterized by a second frequency. A phase lock control loop containing a "delta-sigma" (Δ-Σ) modulator which functions as a voltage controller oscillator synchronizes the data rate of the output stream to that of the input stream in a manner which simplifies attenuation of jitter energy when the output data stream is desynchronized (demapped). The modulator generates an accurate pulse train by duty-cycle dithered modulation of the input stream, which the mapper interprets as stuff/nullide-stuff commands such that the mapping operation is lossless over time (i.e. the number of bits in equals the number of bits out over time) thus allowing utilization of a FIFO buffer without the need to monitor the buffer's depth or its pointers.

6 Claims, 5 Drawing Sheets

JITTER FREQUENCY SHIFTING Δ-Σ MODULATED SIGNAL SYNCHRONIZATION MAPPER

TECHNICAL FIELD

This invention pertains to minimization of low frequency jitter during bit stuff mapping of plesiosynchronous data signals into synchronized data signals.

BACKGROUND

"Bit stuffing" is a well known technique used in synchronizing data signals by "mapping" such signals from one data rate to a different data rate. For example, as shown in FIG. 1, plesiosynchronous signals such as DS-1, DS-2 or DS-3 signals respectively characterized by 1.544 Mb/s, 6.312 Mb/s or 44.736 Mb/s clock rates are commonly mapped from a plesiosynchronous link to a SONET/SDH link having a different characteristic clock rate such as the 1.728 Mb/s rate of the SONET VT1.5 signal. An electronic device known as a "mapper" performs the mapping operation. After transmission over the SONET/SDN link, the signal is desynchronized (demapped) by a demapper which reconverts the SONET/SDH signal to a plesiosynchronous signal for transmission over another plesiosynchronous link.

The bit stuffing technique involves insertion ("stuffing") of positive or negative bits into the data stream during the mapping operation. If these bit "stuffs" are performed in a regular and efficient manner they impose unacceptable low frequency jitter on the mapped data stream. It is very difficult to remove such low frequency jitter when the data stream is desynchronized ("demapped"), particularly in older "legacy" systems utilizing 40 Hz jitter filters. Consequently, the prior art has evolved various bit stuffing techniques for minimizing low frequency jitter by translating jitter energy to higher frequencies at which it is more easily removed.

One prior art technique utilizes phase lock loops (PLLs) incorporating voltage controlled oscillators (VCOs) having frequency characteristics governed by the level of the FIFO buffer (sometimes called an "elastic store") through which the data stream is processed. However, VCO-based PLL techniques involve comparatively expensive analog circuitry. In another prior art technique known as "threshold modulation", the sawtooth-like characteristic of the FIFO buffer fill level is monitored and used to perform dithering of the bit stuffing operation. However, this requires monitoring of the FIFO buffer depth, and access to the FIFO buffer pointers. Moreover, the frequency of the aforementioned sawtooth characteristic affects the higher frequency band into which the jitter energy is translated, constraining circuit design if the sawtooth frequency is fixed.

The present invention addresses the foregoing problems.

SUMMARY OF INVENTION

The invention utilizes a phase lock control loop containing a "delta-sigma" (Δ-Σ) modulator which functions as a VCO to synchronize the data rate of an output data stream to that of an input data stream such that jitter energy is shifted up in frequency, simplifying attenuation of the jitter energy when the data stream is desynchronized (demapped). The modulator generates an accurate pulse train which a mapper incorporating the modulator interprets as stuff/null/ de-stuff commands in such a manner that the mapping operation is lossless over time (i.e. the number of bits in equals the number of bits out over time) thus allowing utilization of a FIFO buffer without the need to monitor the buffer's depth or its pointers.

BRIEF DESCRIPTION OF DRAWINGS

FIG. 5A depicts a 25 Hz 10 unit interval (UI) peak-to-peak jitter signal representative of signals input to the FIG. 2 apparatus; FIG. 5B depicts a 25 Hz 2 UI peak-to-peak jitter signal representative of signals output by the FIG. 2 apparatus; and, FIG. 5C graphically depicts a 25 Hz 1 UI (approx.) peak-to-peak jitter signal obtained after 40 Hz filtration of the FIG. 5B signal.

DESCRIPTION

Figure 1:
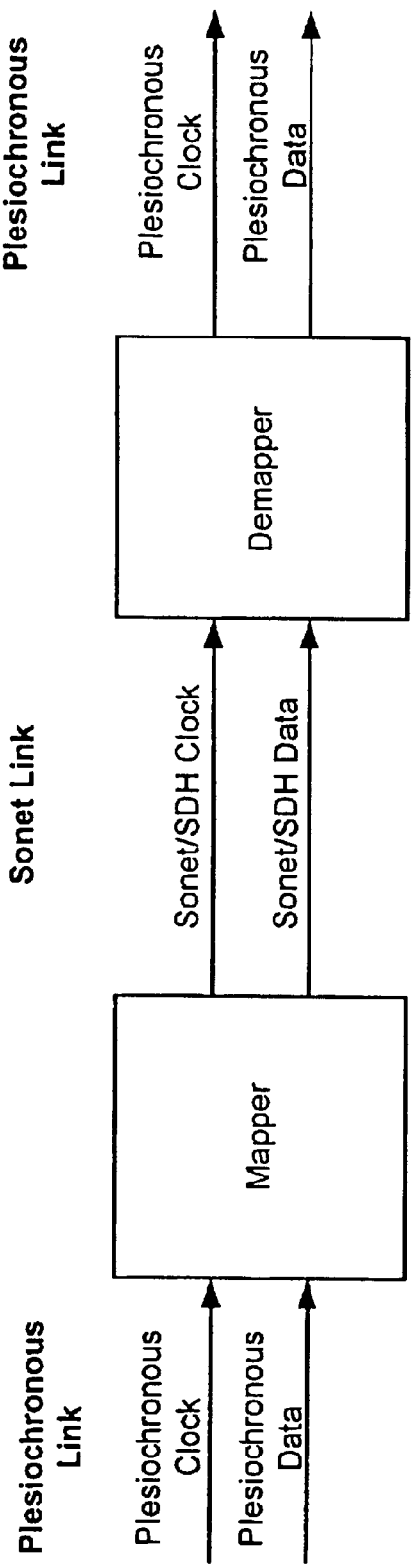
FIG. 1 schematically depicts mapping of signals from a plesiosynchronous link for transmission on a SONET/SDH link and subsequent demapping of the SONET/SDH link for transmission on another plesiosynchronous link.
Figure 2:
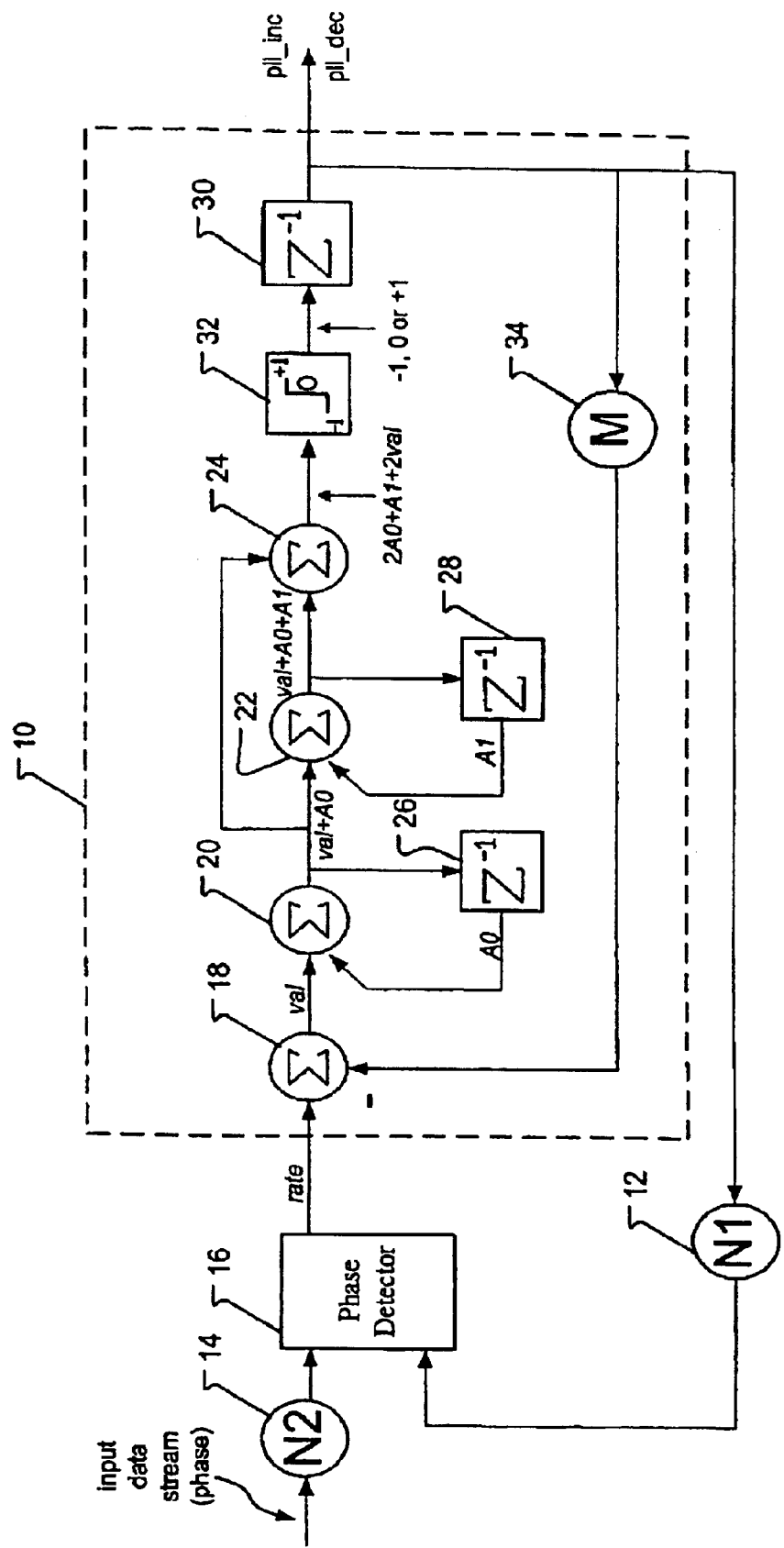
FIG. 2 is a block diagram representation of a first order phase lock loop incorporating a Δ-Σ modulator in accordance with the invention.

FIG. 2 depicts a phase lock loop (PLL) incorporating a Δ-Σ modulator 10 which produces an output signal characterizing the phase (and hence frequency) of the desired output data stream. This output signal is fed back through a first divider 12, which divides the feedback signal by a factor N1. The input signal characterizing the phase (and hence frequency) of the input data stream is a second divider 14, which divides the input signal by a factor N2 to facilitate phase comparison of the aforementioned input and output signals. The signals output by first and second dividers 12, 14 are input to phase detector 16 which outputs a "rate" error signal representative of the phase difference between the input and output data streams. Δ-Σ modulator 10 and its above-described external feedback loop thus forms a first order PLL, with the rate signal output by phase detector 16 driving Δ-Σ modulator 10 as a notional voltage controlled oscillator (VCO) which is implied in the FIG. 2 circuit without requiring an actual (expensive) analog VCO. (The external feedback characteristic constitutes the dominant pole of the FIG. 2 circuit's first order response, although the circuit has higher orders.)

Δ-Σ modulator 10 consists of subtracter 18, adders 20, 22, 24; delay elements 26, 28, 30; quantizer 32 and multiplier 34. Multiplier 34 multiplies the aforementioned output signal produced by Δ-Σ modulator 10 by a factor M. This M-multiplied signal is applied to the "−", input of subtracter 18 to establish the interval over which subtracter 18 integrates the rate signal output by phase detector 16, resulting in output of a signal val by subtracter 18. Adder 20 adds the val signal output by subtracter 18 to the A0 signal output by delay element 26, resulting in output of a signal A0+val by adder 20. Adder 22 adds the A0+val signal output by adder 20 to the A1 signal output by delay element 28, resulting in output of a signal A0+A1+val by adder 22. Adder 24 adds the A0+A1+val signal output by adder 22 to the A0+val signal output by adder 20, resulting in output of a signal 2A0+A1+2val by adder 24. Quantizer 32 outputs −1, 0, or +1 depending on whether the signal 2A0+A1+2val output by adder 24 is respectively less than, between, or greater than the quantizer's threshold values ±[(M/2)+$K_S$], where M, $K_S$ are constants as hereinafter explained. In the preferred embodiment $K_S$=36 and M=4,094. Therefore, ±[(M/2)+$K_9$]= ±2,083. If the value output by adder 24 (i.e. 2A0+A1+2val) exceeds 2,083 then quantizer 32 outputs the value +1. If (2A0+A1+2val)<−2,083 then quantizer 32 outputs the value −1. If −2,083≦(2A0+A1+2val)≦2,083 then quantizer 32 outputs the value 0. See Riley et al "Delta-Sigma Modulation in Fractional-N Frequency Synthesis", *IEEE Journal of Solid-State Circuits* Vol. 28, No. 5, May 1993, pp. 553–559 for further details of Δ-Σ modulators, particularly factors affecting stability and overflow characteristics thereof.

Figure 5A:
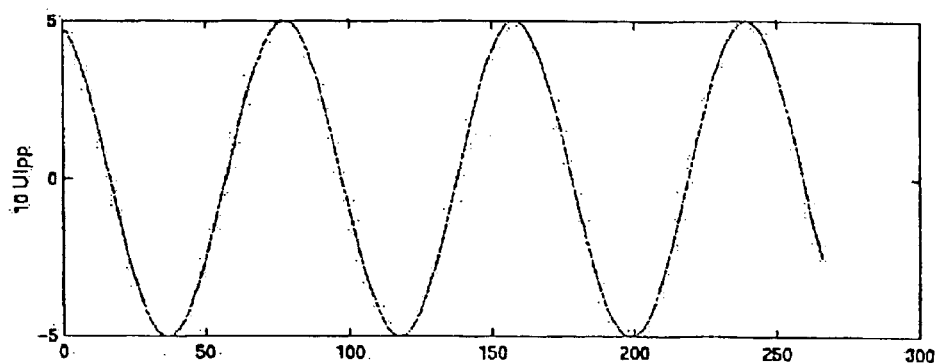
FIGS. 5A–5C graphically illustrate the 10:1 jitter attenuation achievable by the invention.
Figure 5B:
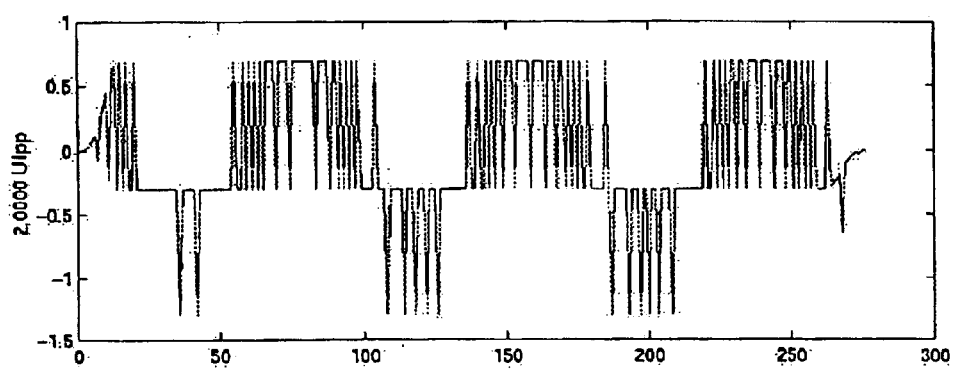
Figure 5C:
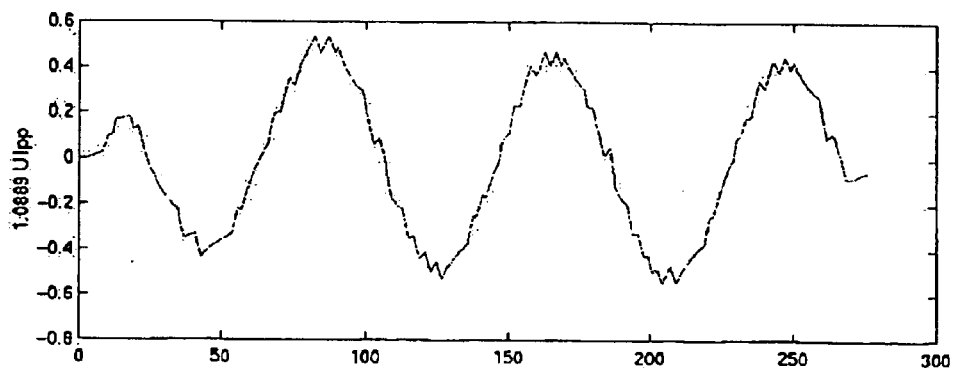

The −1, 0, or +1 signals output by quantizer 32 are processed by delay element 30 which in turn outputs either a phase increment (pll_inc) command signal to insert a stuff bit into the mapped VC-11 or VC-12 in the output SONET/SDH data stream; or, a phase decrement (pll_dec) command signal to remove a stuff bit from the output data stream. Only one or the other of pll_inc or pll_dec can be asserted at one time to either speed up or slow down the output data stream. If neither pll_inc nor pll_dec are asserted then a null operation is performed, such that the output data stream's rate remains unaffected. It can thus be seen that the "rate" signal output by phase detector 16 (i.e. the difference between the actual and desired frequencies of the signal output by Δ-Σ modulator 10) is used to proportionately steer the duty cycle of Δ-Σ modulator 10 toward the desired average value by making the modulator's average output value equal to the input value. The time required to accomplish such steering results in a low pass jitter attenuation effect which is apparent by comparison of FIGS. 5A, 5B and 5C. As seen in FIG. 5C, some high frequency noise is an inevitable side effect of the modulator's operation, but such noise can be readily dealt with and is therefore tolerable.

Figure 3:
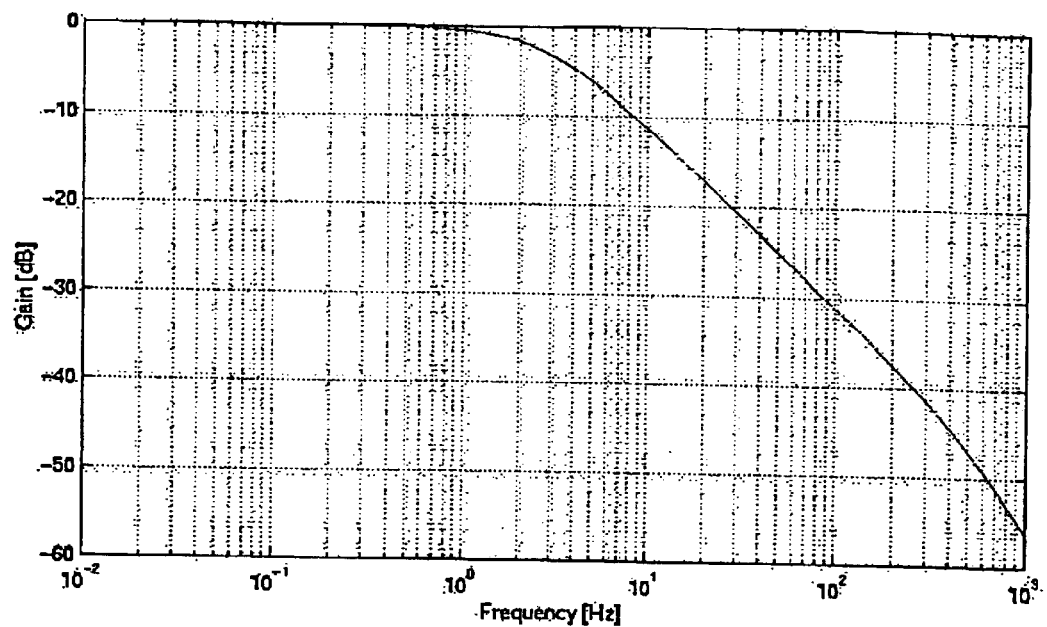
FIG. 3 graphically depicts the system transfer function of the FIG. 2 apparatus, with the upper plot depicting the gain vs. frequency characteristic and the lower plot depicting the phase vs. frequency characteristic.
Figure 3:
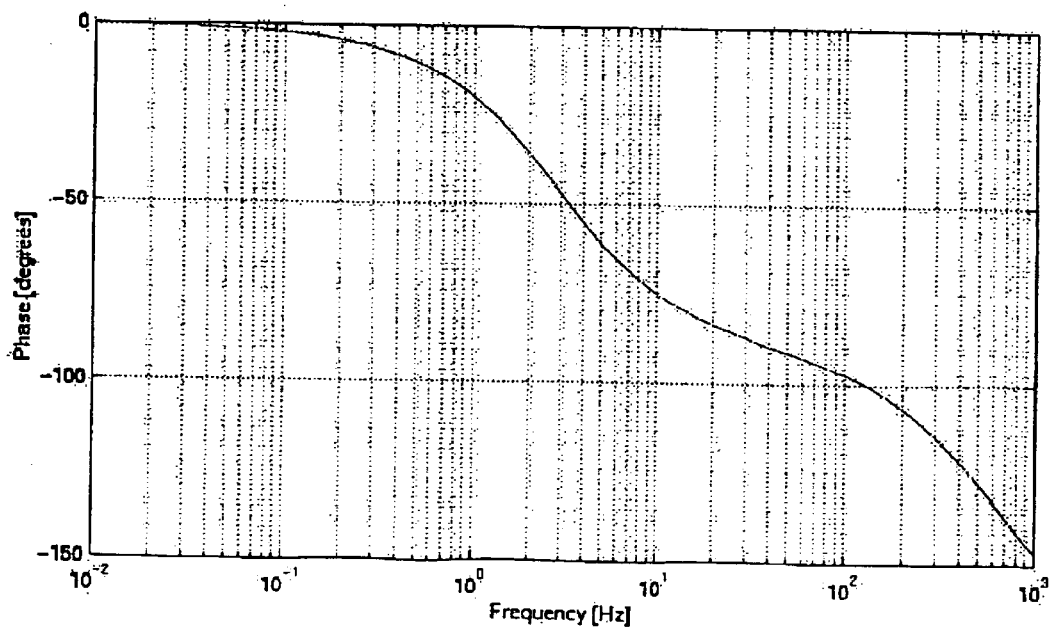

FIG. 3 graphically depicts the transfer function of the FIG. 2 apparatus, which is characterized by the following parameters:

$$\text{Input Gain: } K_i = \frac{1}{N2}$$

$$\text{Transfer Function: } T(s) = \frac{k_i \times G(s)}{1 + G(s) \times H(s)}$$

$$\text{Forward Gain: } G(s) = K_{pd} \times Sig(s) \times K_{vco} \times \frac{1}{s} \text{ where}$$

$$Sig(s) = \frac{s+1}{(s^2 + sM + M)}$$

$$\text{Reverse Gain: } H(s) = \frac{1}{N2}$$

$$\text{VCO Gain: } K_{vco} = \frac{2 \times \pi \times F_o}{N1}$$

$$\text{Phase Detector Gain: } K_{pd} = \frac{N2 \times K_s}{2 \times \pi}$$

In a preferred embodiment of the invention suitable for mapping T1 and E1 tributaries to SONET/SDH streams, the following T1 mode constants were used: $F_0$=1.544e6, N1=772, N2=772, M=4094, and Ks=36. The control loop depicted in FIG. 2 has an effective 2 KHz operating frequency, with outputs (i.e. the aforementioned pll_inc, pll_dec, or an absence of either) produced every 500 μs, corresponding to the bit stuff/destuff opportunities presented during synchronization of SONET/SDH data streams.

Figure 4:
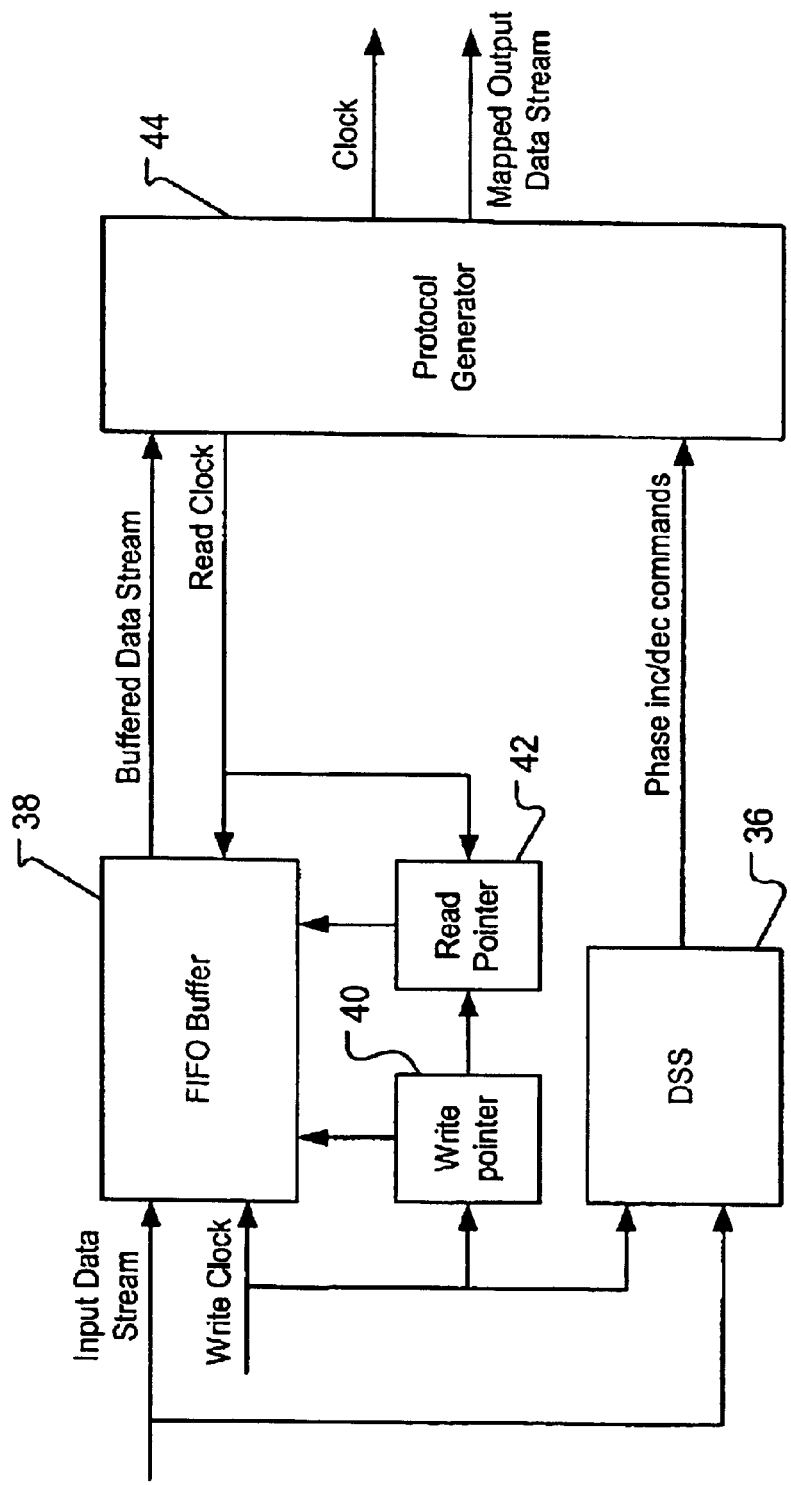
FIG. 4 is a block diagram representation of a signal synchronization mapper incorporating the FIG. 2 apparatus.

As shown in FIG. 4, a mapper incorporating a delta-sigma modulator-based signal synchronizer (DSS) 36 including the phase locked loop as shown in FIG. 2 requires no communication between FIFO buffer 38 and DSS 36 (i.e. buffering of the input stream to the output stream is independent of the above-described duty-cycle dithered modulation of the input stream's jitter). FIFO buffer 38 accommodates the instantaneous frequency difference between the input and output data streams. The mapper has a low pass response and will not track high frequency jitter. DSS 36 measures the phase of the input data stream as data enters FIFO buffer 38 and regulates the phase of the output data stream by generating phase increment/phase decrement commands as previously explained. Protocol generator 44 combines the phase increment/phase decrement commands with data read from buffer 38 thereby allowing data throughput to be matched in an inherently lossless (albeit discrete) manner. Data is written blindly into FIFO buffer 38, such that DSS 36 does not need to keep track of the buffer's write pointer 40. Only the buffer's read pointer 42, which is separate from DSS 36, keeps track of write pointer 40. If no data is available, read pointer 42 is not adjusted. If FIFO buffer 38 is full, data is read out of the buffer. In either case, for a brief time during initialization, overflow and underflow of buffer 38 serves to effectively center write pointer 40 and read pointer 42 with respect to buffer 38. Such initialazation-centering of the buffer pointers corrupts the data stream, but this is inconsequential due to its very temporary nature. Once the pointers are centered, further data corruption is avoided since the above-described control loop incorporated in DSS 36 compensates for changes in relative frequency within the loop's bandwidth (i.e. data is transferred from buffer 38 to protocol generator 44 and thence to the mapped output data stream on a first-in first-out basis and at a rate which prevents post-initialzation overflow and underflow of buffer 38). Given the aforementioned lossless phase measurement, this centering mechanism can be separated from DSS 36, thus avoiding complicating the design of DSS 36.

As will be apparent to those skilled in the art in the light of the foregoing disclosure, many alterations and modifications are possible in the practice of this invention without departing from the spirit or scope thereof. For example, the foregoing description assumes a protocol which allows only one bit to be "stuffed" during each bit stuff/destuff opportunity. The invention is readily adapted to use with protocols allowing a plurality of bits to be stuffed during each bit stuff/destuff opportunity. This can be accomplished by replacing tri-level quantizer 32 with a multi-level quantizer, since stability and accuracy issues affecting the operation of multi-level quantizers in Δ-Σ modulators affect only analog implementations. Accordingly, the scope of the invention is to be construed in accordance with the substance defined by the following claims.

What is claimed is:

1. A signal synchronization mapper for mapping an input data stream characterized by a first frequency into an output data stream characterized by a second frequency, said mapper comprising:
  (a) a Δ-Σ modulator driven by a signal representative of phase difference between:
    (i) said input data stream;
    (ii) an output signal produced by said Δ-Σ modulator;
  (b) a FIFO buffer coupled between said input and output data streams, said FIFO buffer having a write pointer and a read pointer, said FIFO buffer further coupled to receive a write clock signal and a read clock signal;
wherein said Δ-Σ modulator is coupled between said input and output data streams:
  (A) without input to said Δ-Σ modulator of signals output by said write pointer or by said read pointer;

(B) without input to said write pointer or to said read pointer of signals output by said Δ-Σ modulator, and (C) without coupling said read clock signal to said Δ-Σ modulator.

2. A signal synchronization mapper as defined in claim 1, further comprising:

(a) a phase detector having an output coupled to an input of said Δ-Σ modulator;

(b) a first divider connected between an output of said Δ-Σ modulator and a first input of said phase detector, said first divider dividing signals output by said Δ-Σ modulator by a factor N1;

(c) a second divider connected between said input data stream and a second input of said phase detector, said second divider dividing said input data stream by a factor N2; and said phase detector producing an output signal representative of phase difference between signals applied to said respective first and second phase detector inputs.

3. A signal synchronization mapper as defined in claim 2, wherein said Δ-Σ modulator further comprises a multiplier coupled between said input and said output of said Δ-Σ modulator, said multiplier multiplying said signals output by said Δ-Σmodulator by a factor M.

4. A signal synchronization mapper as defined in claim 3, wherein said Δ-Σ modulator further comprises a tri-level quantizer for producing said signals output by said Δ-Σ modulator, and wherein said signals output by said Δ-Σmodulator comprise a single bit stuff/destuff indicator for each stuff/destuff opportunity provided by a protocol characterizing data communication via said input and output data streams.

5. A signal synchronization mapper as defined in claim 4, wherein:

(a) said quantizer has threshold characteristics $\pm[(M/2)+K_1]$, where $K_1$ is a pre-defined constant;

(b) said bit stuff/destuff indicator comprises:

(i) −1 when signals input to said quantizer are less than said threshold characteristics;

(ii) 0 when signals input to said quantizer are between said threshold characteristics; and, (iii) +1 when signals input to said quantizer are greater than said threshold characteristics.

6. A signal synchronization mapper as defined in claim 3, wherein said Δ-Σ modulator further comprises a multi-level quantizer for producing said signals output by said Δ-Σ modulator, and wherein said signals output by said Δ-Σ modulator comprise a plurality of bit stuff/destuff indicators for each stuff/destuff opportunity provided by a protocol characterizing data communication via said input and output data streams.

* * * * *